(12) United States Patent
Hanson

(10) Patent No.: US 6,395,636 B1
(45) Date of Patent: May 28, 2002

(54) METHODS FOR IMPROVED PLANARIZATION POST CMP PROCESSING

(75) Inventor: Eric Ian Hanson, Maple Grove, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/757,879

(22) Filed: Jan. 9, 2001

(51) Int. Cl.[7] .................... H01L 21/302; H01L 21/461
(52) U.S. Cl. ........................... 438/692; 438/697
(58) Field of Search ........................ 438/625, 626, 438/631, 633, 635, 637, 662, 663, 668, 669, 680, 681, 692, 697, 706, 708, 709, 734, 942

(56) References Cited

U.S. PATENT DOCUMENTS

| | | | | |
|---|---|---|---|---|
| 5,139,608 A | * | 8/1992 | Grivna | 156/643 |
| 5,328,553 A | * | 7/1994 | Poon | 156/636 |
| 5,928,960 A | | 7/1999 | Greco et al. | 438/692 |
| 5,981,354 A | | 11/1999 | Spikes et al. | 438/424 |
| 6,004,653 A | | 12/1999 | Lee | 428/141 |
| 6,008,116 A | | 12/1999 | Tran | 438/623 |
| 6,020,249 A | * | 2/2000 | Shih et al. | 438/401 |
| 6,051,496 A | * | 4/2000 | Jang | 438/687 |

* cited by examiner

Primary Examiner—Viet Q. Nguyen
Assistant Examiner—David Nhu
(74) Attorney, Agent, or Firm—Dennis C. Bremer

(57) ABSTRACT

The present invention provides a method for improving the planarization of a top layer deposited over a patterned layer on a semiconductor wafer. The patterned layer may include both small and large features. Openings, grooves, or trenches are etched partially or completely through certain larger target features in the patterned layer in an effort to mimic the topography of areas where the patterned layer includes smaller features. Subsequent deposition of the top layer may result in a more consistent or regular topography across the surface of the top layer. Accordingly, high areas on the top layer that contact a polishing pad of a CMP system will tend to be removed at a similar rate since the pressure exerted by each of the high areas will be similar.

12 Claims, 15 Drawing Sheets

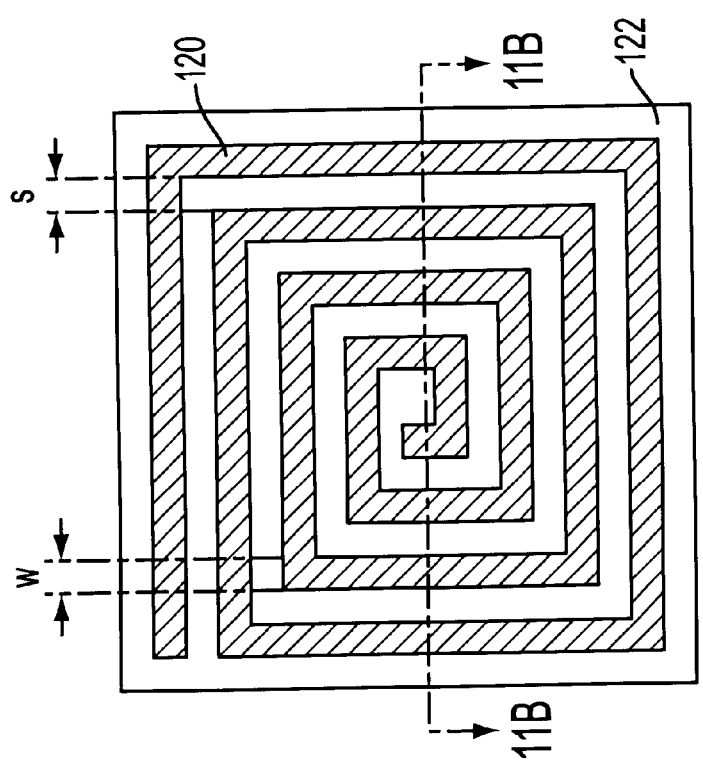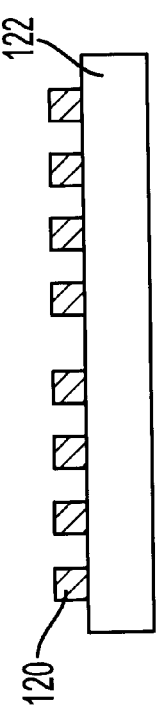
FIG. 11A
FIG. 11B

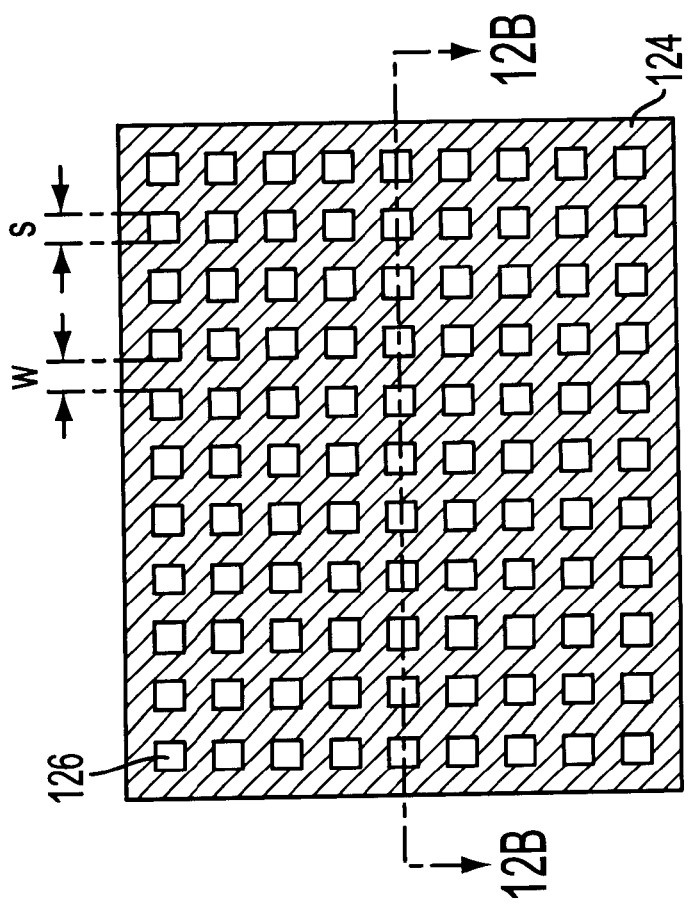
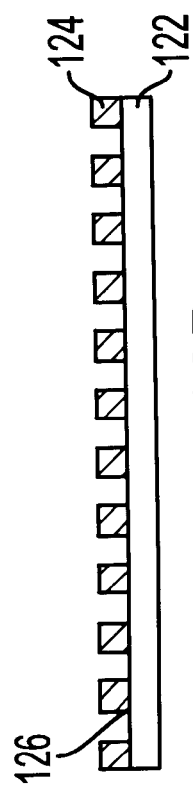

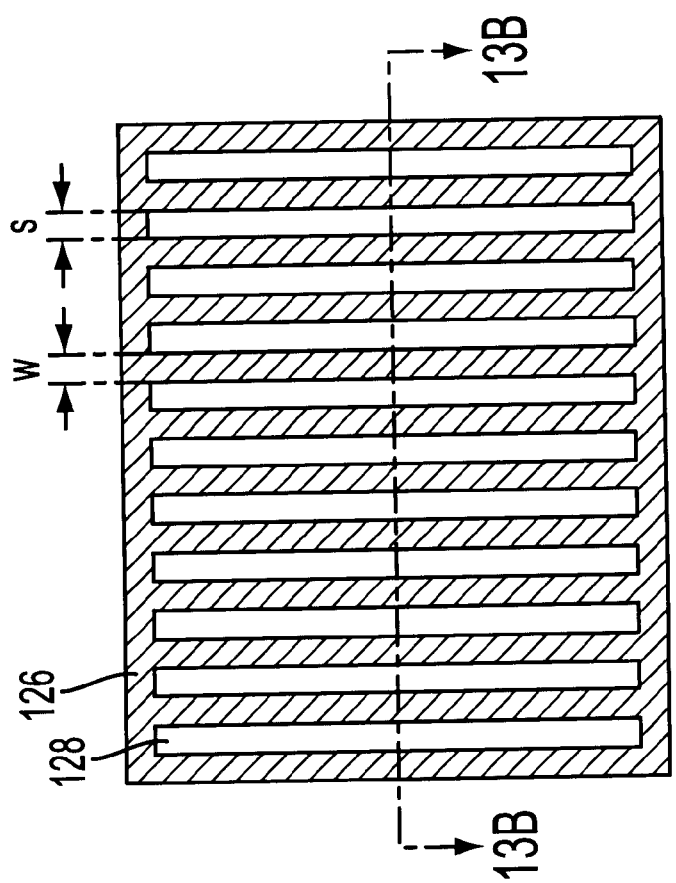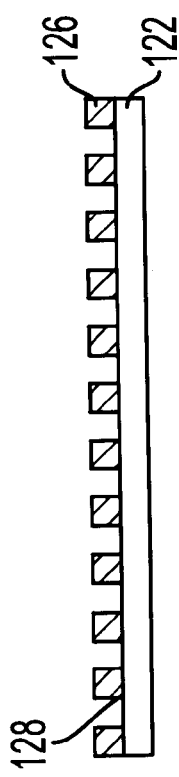
FIG. 13A
FIG. 13B

METHODS FOR IMPROVED PLANARIZATION POST CMP PROCESSING

BACKGROUND OF THE INVENTION

FIELD OF THE INVENTION

This invention relates generally to the field of integrated circuit manufacturing, and more specifically to methods for improving the planarization of a wafer when using Chemical Mechanical Polishing.

Moore's Law, which is named after Gordon Moore, the founder of Intel Corporation, states that the speed and density of computers will double every 18–24 months. A corollary to Moore's Law is that the size of the transistors and other features used in integrated circuits will shrink by a factor of two every 18–24 months. For the most part, Moore's Law has held true since the early days of the microprocessor.

As the feature sizes decrease and the number of devices increase, the number of the interconnect lines must also increase. To accommodate the increasing number of interconnect lines, many manufacturing processes allow several metal interconnect layers. When providing more metal interconnect layers, the surface topology of each layer becomes increasingly important. It is known that adverse surface topologies may reduce the reliability or current carrying capabilities of a subsequently deposited metal layer, particularly near "steps" on the surface. Adverse surface topologies also tend to prevent minimum features sizes from being formed on subsequent layers because the optics used by many photolithography systems to create minimum feature sizes do not have a sufficient depth of field to properly focus on the various undulations in the non-planar surface.

Various planarization techniques have been developed to improve the surface topology of selected layers. Early techniques for planarization included reflow and etchback. Reflow involves the use of an oxide layer such as borophosphosilicate glass (BPSG), which is deposited over a patterned layer of the wafer and then heated. Heating the BPSG causes the BPSG to melt, which then forms a relatively planar top surface on which a subsequent metal layer may be deposited. A limitation of this technique is that the melted BPSG often does not sufficiently planarize the surface, particularly when subsequent layers include small feature sizes such as submicron features sizes.

Like reflow, etchback involves the use of a thick oxide deposited over a patterned metal layer. However, rather than melting the oxide layer, a thick layer of photoresist is deposited on top of the oxide layer, and the wafer is placed in a plasma etch system. The plasma etch system is set so that the etch rates for the oxide and the photoresist are nearly identical. The wafer is then etched until all of the photoresist is removed, which also removes the higher regions of the oxide layer. The cycle is repeated if necessary. A limitation of this technique is that the etching process often follows the surface topology of the resist layer, which is not completely planar. Thus, etchback tends to only smooth out the steps.

A more recently developed technique is called Chemical Mechanical Polishing (CMP). CMP involves the deposition of a thick dielectric layer, which is often chemically deposited in a reactor using heat and/or RF or spun on the wafer and cured to remove trapped organics, or a combination of both. The wafer is then chemically and mechanically polished using a polishing pad, which uses a slurry of abrasives and one or more etching agents.

A limitation of CMP is that the degree of planarization is often dependent on the topography of the underlying patterned layer. For example, variations in topography can cause local variations in pressure on the polishing pad. High areas that have small underlying feature dimensions tend to exert a greater mechanical pressure on the polishing pad than high areas that have relatively large underlying feature dimensions. Accordingly, the high areas that have small underlying feature dimensions tend to be removed more quickly than those areas that have larger underlying feature dimensions. As a result, the amount of material that is removed during the CMP process tends to vary over the surface of the wafer, resulting in undesirable variations in surface topography.

A need exists, therefore, for an improved method of CMP planarization that reduces the variations in the resultant surface topography due to variations in the topography of the underlying layers.

SUMMARY OF THE INVENTION

The present invention overcomes many of the disadvantages of the prior art by providing an improved method of CMP planarization that reduces variations in the resultant surface topography due to variations in the topography of the underlying layers. The improved method adds only a minimum number of additional processing steps such that wafer costs remain low.

In a preferred embodiment, the present invention provides a method for improving the planarization of a top layer that is deposited over a patterned layer on a semiconductor wafer. The patterned layer may include both small and larger features. In accordance with the present invention, openings, grooves, or trenches are etched partially or completely through certain large target features in the patterned layer in an effort to mimic the topography of areas where the patterned layer includes smaller features. This may reduce the variations in the topography of the patterned layer so that when a top layer is provided over the patterned layer, all of the high areas of the top layer will be removed at similar rates by the polishing pad of a CMP system. Preferably, the target features are relatively large feature such as a bonding pad, power bus, polysilicon capacitor, ESD diode, etc.

In one illustrative method of the present invention, a first layer of photoresist is deposited on top of an unpatterned underlying metal, oxide, poly or other layer. The layer of photoresist is patterned twice using two different masks. During a first exposure, the layer of photoresist is exposed using a first mask for a first predetermined time. The first predetermined time is preferably sufficient to develop the photoresist layer from front to back. The first mask can be used to define a pattern in the underlying layer, which may be required for circuit functionality. Then, and before developing the photoresist, the photoresist layer is exposed using a second mask for a shorter duration of time so that the pattern defined by the second mask is not developed entirely through the photoresist layer. The second mask can be used to define a pattern for partially etching the at least one opening, groove, or trench in the target features.

The photoresist layer is then developed, which removes all of those portions exposed using the first mask and only part of the those portions exposed using the second mask. The top surface of the wafer is then exposed to an etchant. The etchant is selected to etch both the remaining photoresist as well as the exposed underlying layer at some predefined selectivity, preferably at similar rates. Thus, in those areas where some photoresist remains, the etchant must first etch through the photoresist before etching the underlying metal layer. Accordingly, the at least one groove, trench, or opening in the target features are etched to a depth typically less than the depth of the patterned underlying layer (e.g. one-half the thickness of the underlying oxide, metal, poly or other underlying layer). A top layer is then provided on the patterned layer, and the top layer is planarized using a conventional CMP process.

In another illustrative method of the present invention, and prior to etching the at least one opening, trench, or groove, a first layer of photoresist is deposited on top of the unpatterned underlying layer. The layer of photoresist is patterned by exposing the layer of photoresist during a photolithogaphy process using a first mask for a predetermined duration of time. After the first layer of photoresist is developed, a pattern is etched a pre-determined depth into the underlying layer of material. In one embodiment, the first mask is used to define the pattern that is required for circuit functionality or operation. The remaining photoresist is then removed, and a second layer of photoresist is provided on top of the patterned layer and exposed during a second photolithography process using a second mask for a pre-determined duration of time. The second layer of photoresist may define a pattern for etching the at least one opening, groove, or trench in the target features of the patterned layer. After the second layer of photoresist is developed, the at least one groove, trench, or opening is etched a predetermined depth into the target features. The at least one groove, trench or opening may be etched only part way through the underlying layer, or all the way through as desired. A top layer is then provided on the patterned layer. Finally, the top layer is planarized using a conventional CMP process.

In another illustrative embodiment of the present invention, a single mask is used to define both the pattern in the underlying material that is required for circuit functionality and the at least one opening, groove, or trench in selected target features. The mask is a conventional photolithography mask that has been designed to define at least one opening, groove, or trench in selected target features. This may provide more consistent surface topology across the surface of the wafer.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIGS. 11A–11B represent a top view and a cross-section view, respectively, of a spiral metal bonding pad;

FIGS. 12A–12B represent a top view and a cross-section view, respectively, of a grooved metal bonding pad having a number of openings formed therein;

FIGS. 13A–13B represent a top view and a cross-section view, respectively, of a longitudinally grooved metal bonding pad;

DETAILED DESCRIPTION OF THE PREFERRED EMBODIMENTS

Figure 1:
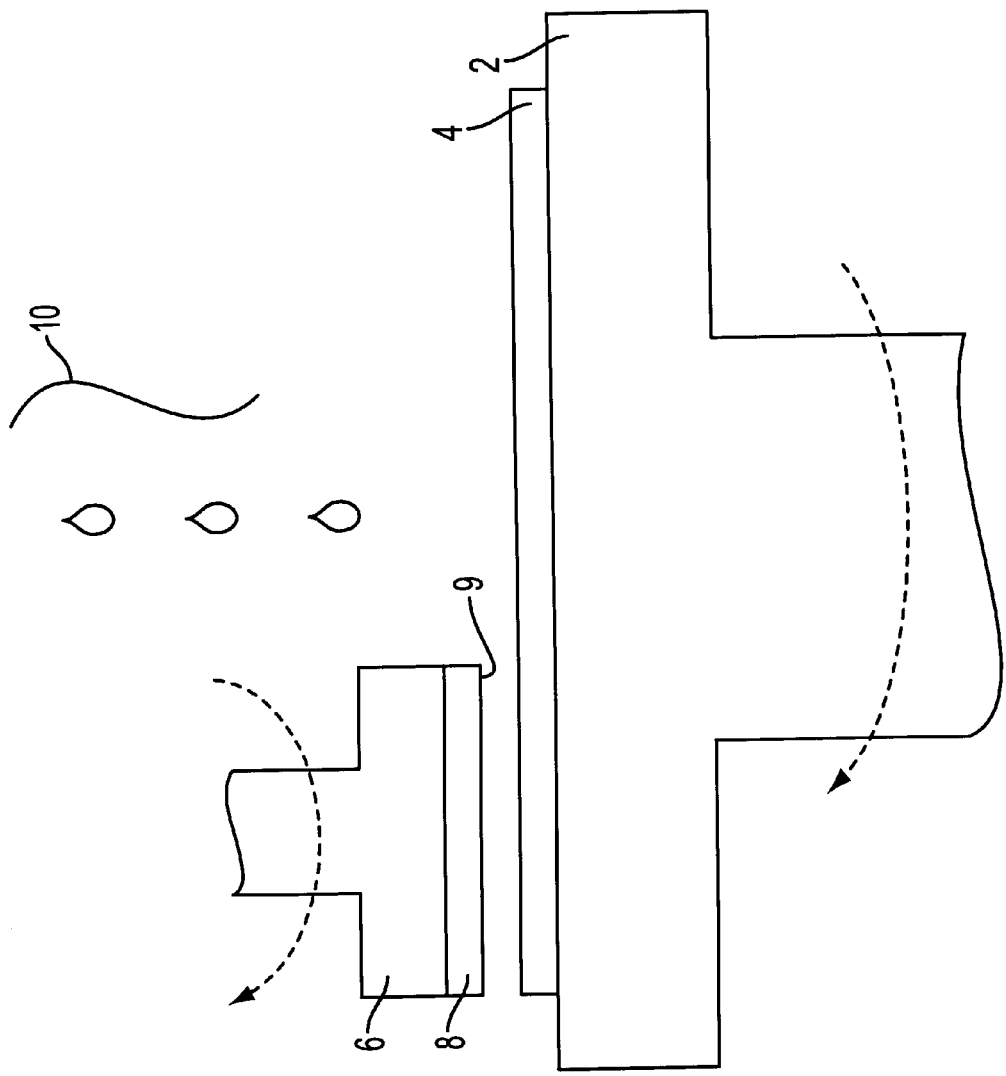
FIG. 1 is a schematic representation of a typical CMP system.

FIG. 1 is a schematic representation of a typical CMP processing system. The CMP processing system includes a Table 2 and a Polishing Pad 4. Table 2 and Polishing Pad 4 rotate relative to Wafer Carrier 6. Wafer Carrier 6 carries Wafer 8 and may also rotate. Under controlled surface pressure, Top Surface 9 of Wafer 8 is polished via Polishing Pad 4. To aid in polishing Top Surface 9 of Wafer 8, Chemical Slurry 10 may be used. Chemical Slurry 10 may contain both one or more etchants and one or more abrasives. The type of Chemical Slurry 10 will often depend on the type of material to be removed from Top Surface 9 of Wafer 8. In some CMP processes, a chemical slurry is not used (e.g. a slurryless CMP processes).

Figure 2:
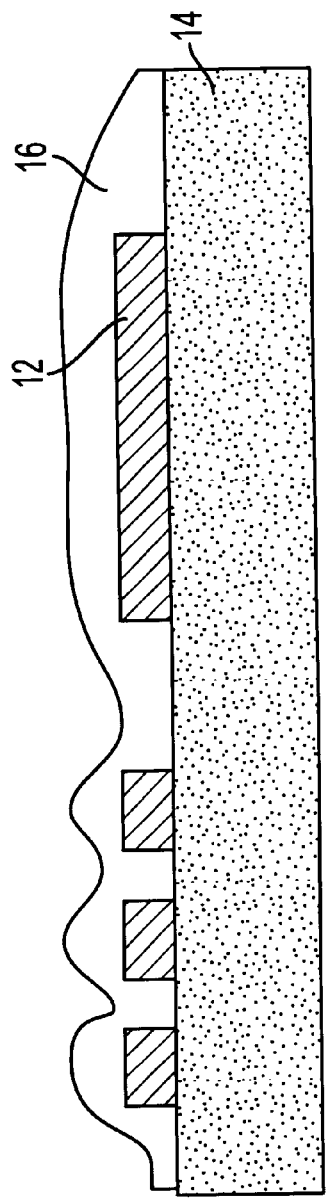
FIG. 2 is a cross-sectional representation of a wafer containing a substrate layer, patterned metal layer, and an Inter Layer Dielectric (ILD)
Figure 3:
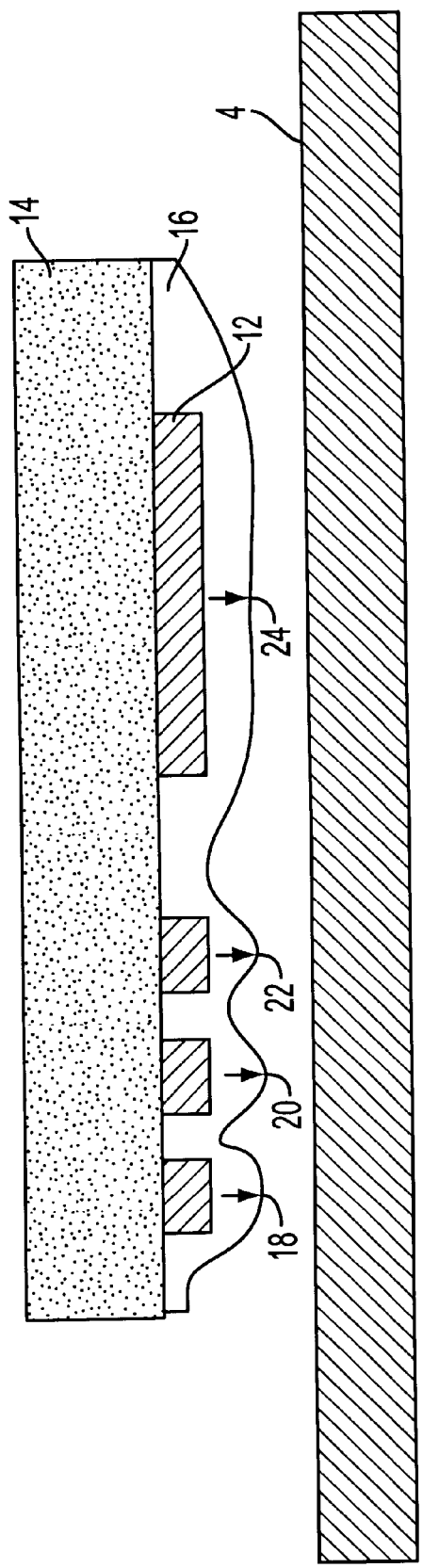
FIG. 3 is a cross-sectional representation of the wafer shown in FIG. 2 placed adjacent to a polishing pad of a CMP system.

FIG. 2 is a cross-sectional representation of a Wafer 8 having a Patterned Layer 12 positioned on a Substrate 14. It is contemplated that the patterned metal layer 12 may be any type of material, such as oxide, metal, poly, etc. A layer of Inter Layer Dielectric (ILD) 16 is also shown on top of the Patterned Layer 12. In FIG. 3, Wafer 8 is shown positioned adjacent Polishing Pad 4. When Polishing Pad 4 is initially brought into engagement with ILD 16, Polishing Pad 4 initially contacts four areas 18, 20, 22, 24. Assuming that Wafer 8 engages Polishing Pad 4 at a controlled and uniform pressure, the pressure per unit area for areas 18, 20, and 22 will be greater than the pressure per unit area for area 24. Therefore, areas 18, 20 and 22 will tend to polish more quickly due to larger mechanical pressure. It is this uneven polishing that the present invention intends to address.

Figure 4:
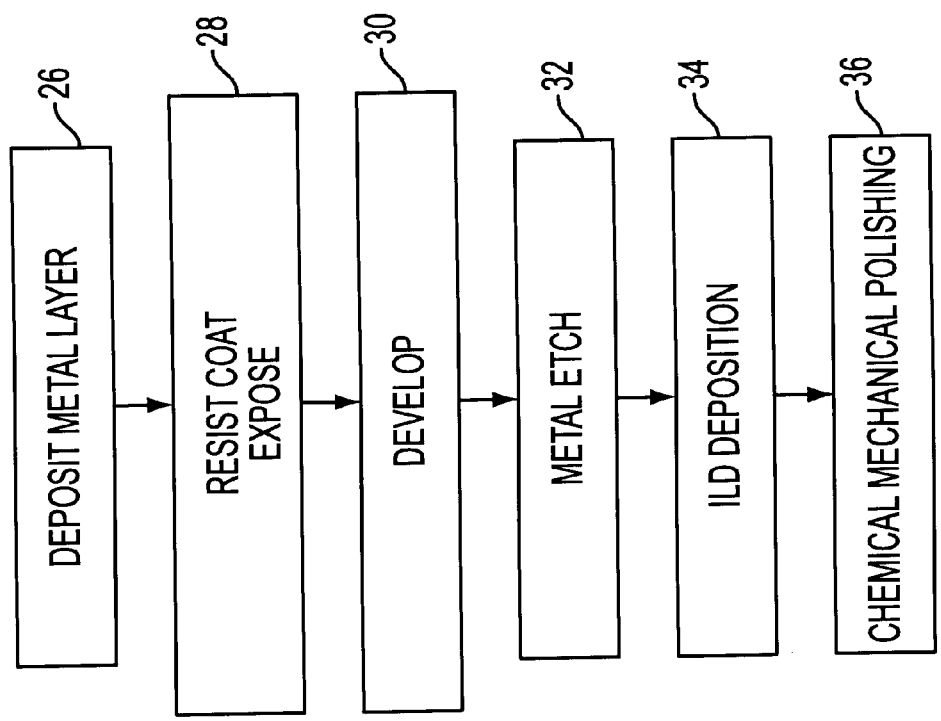
FIG. 4 is a flow diagram of a typical metal deposition, metal etch, ILD deposition, and CMP process.

FIG. 4 is a flow diagram of a prior art CMP process for an ILD layer provided over a metal layer. At step 26, a metal layer is deposited. At step 28, a photoresist is applied, and is exposed to a pattern using a mask. At step 30, the photoresist is developed such that portions of the underlying metal layer are exposed. During Step 32, the exposed portions of the metal layer are etched away. At step 34, a layer of ILD is deposited. At step 36, the ILD is planarized using a CMP process.

Figure 5A:
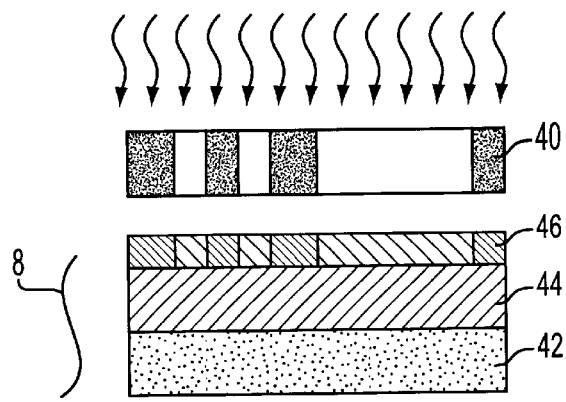
FIGS. 5A–5D are the cross-sectional wafer representations of the process of FIG. 4.

FIGS. 5A–5D show cross-sectional representations of the wafer formed using the steps described in FIG. 4. In FIG. 5A, Wafer 8 includes substrate 42, Metal Layer 44, and Photoresist Layer 46. Metal Layer 44 is deposited using conventional methods well known to those skilled in the art. Substrate 42 may include multiple layers, including those typically used to fabricate integrated circuits. For simplicity, however, Wafer 8 is represented as a single layer. Wafer 8 may be exposed using Mask 40 and a conventional photolithography process. The light emitted during the photolithography process alters the chemical nature of the exposed portions of Photoresist Layer 46 so that a subsequent developing process can remove the chemically altered portions.

Figure 5B:
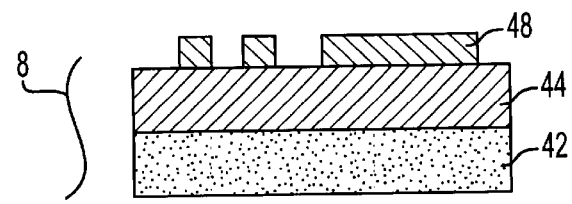
Figure 5C:
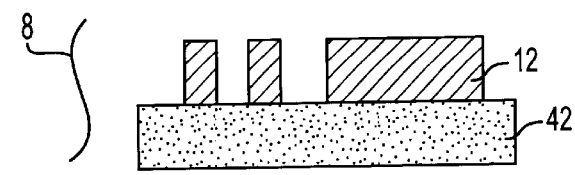

FIG. 5B is a cross-sectional representation of Wafer 8 after the Photoresist Layer 48 has been developed and the chemically altered portions of Photoresist Layer 46 are removed, leaving a Patterned Photoresist Layer 48 on top of Metal Layer 44. FIG. 5C is a cross-sectional representation of Wafer 8 after Metal Layer 44 has been etched and Patterned Photoresist Layer 48 has been removed, leaving only a Patterned Metal Layer 12 on top of Substrate 42. Metal Layer 44 is etched using conventional etching processes well known to those skilled in the art.

Figure 5D:
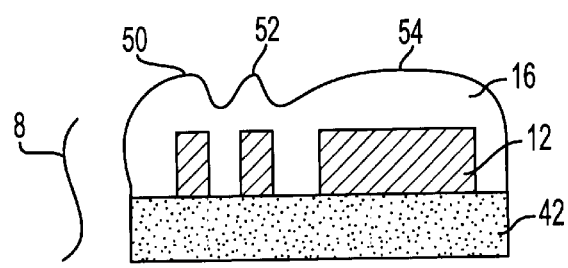

FIG. 5D is a cross-sectional representation of Wafer 8 after the deposition of ILD 16 on Patterned Metal Layer 12. ILD 16 may be deposited using conventional methods well known to those skilled in the art. As can be seen, the topology of ILD 16 tends to conform somewhat to the topology of Patterned Metal Layer 12. Therefore, and as discussed above, a subsequent CMP process on ILD 16 will often result in uneven rates of planarization at areas 50 and 52 versus area 54 due to the resulting difference in pressure per unit area exerted on the polishing pad.

Figure 6:
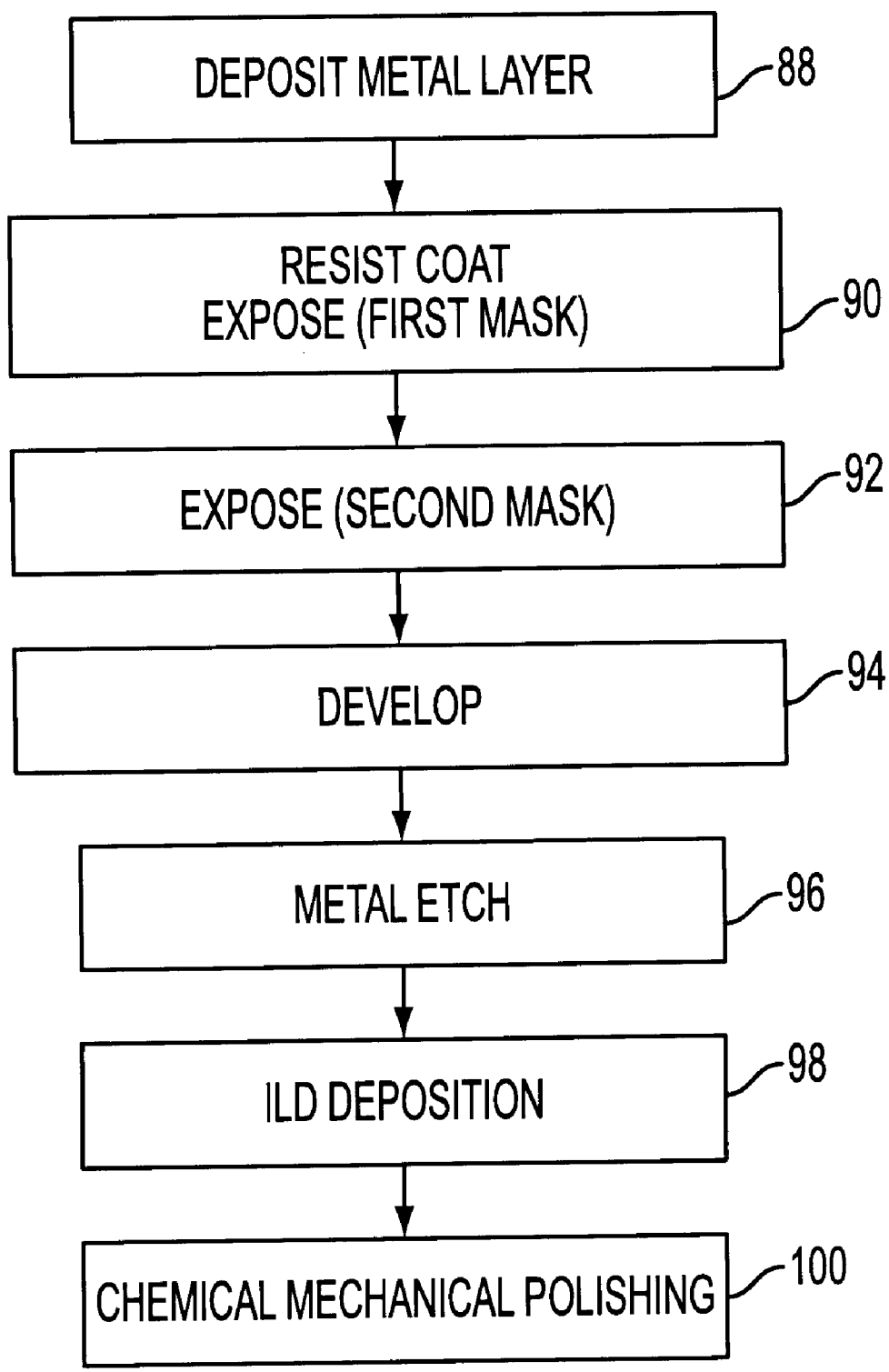
FIG. 6 is a flow diagram of an illustrative metal deposition, metal etch, ILD deposition, and CMP process in accordance with the present invention.

FIG. 6 is a flow diagram of an illustrative embodiment of the present invention. At step 88, a metal layer is deposited. While a metal layer is used for illustration, any layer may be provided. At step 90, photoresist is applied and exposed to a pattern using a first mask for a first period of time. The first period of time is preferably the same period of time used in a conventional metal etching process, but it may be less. The first mask is used to define the metal pattern desired to form the portions of the metal layer required for circuit functionality or operation.

At step 92, the wafer is again exposed using a second mask. The second mask is used to pattern certain select portions of pre-selected target features of the metal layer to alter the topography of the target features. Preferably, the target features are those features that have a lateral dimension that is at least as great as two times the minimum layer width plus the minimum layer spacing, or the minimum layer width plus two times the minimum layer spacing, as defined by the design rules. The wafer is then exposed for an equal or shorter period of time than the exposure time for the first mask so that the pattern defined by the second mask is not developed entirely through the photoresist. At step 94, the photoresist is developed so that all or part of the exposed portions is removed.

At step 96, the top surface of the wafer is subject to a metal etchant. The metal etchant is selected to also etch the remaining photoresist, as well as the exposed metal layer, preferable at similar rates. Thus, in those areas where some photoresist remains, the etchant must etch through the photoresist before etching the underlying metal layer. Accordingly, the select portions of the target features are etched to a depth that is less than or equal to the depth of the patterned metal layer. At step 98, a layer of ILD is deposited. At step 100 the ILD is planarized using a CMP process.

Figure 7A:
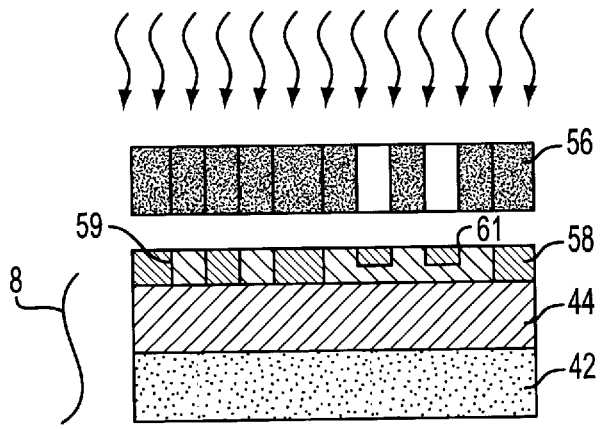
FIGS. 7A–7D are cross-sectional wafer representations of the illustrative process of FIG. 6.

FIGS. 7A–7D show a cross-sectional representation of a wafer formed using the steps described in FIG. 6. In FIG. 7A, Wafer 8 includes substrate 42, Metal Layer 44, and Photoresist Layer 58. Lines 59 in Photoresist Layer 58 show the result of exposure to a first mask, Mask 40, as shown in FIG. 5A. As stated above, and for simplicity, Substrate 8 is represented as a single layer.

Wafer 8 is then exposed using a second photolithography process. The second photolithography process is a standard process well known to those skilled in the art. The exposure time for the second photolithography process may be less than or equal to the exposure time for the first photolithography process. The light emitted from the photolithography process alters the chemical nature of the exposed portions of Photoresist Layer 58 so that a subsequent developing process can remove the chemically altered portions. In the example shown in FIG. 7A, the second photolithography process exposure time is less than the first photolithography process exposure time resulting in regions 61 that do not extend all the way through Photoresist Layer 58. Therefore, the subsequent developing process results in Photoresist Layer 60 with both Thin Resist Areas 63 and Thick Resist Areas 65.

Figure 7B:
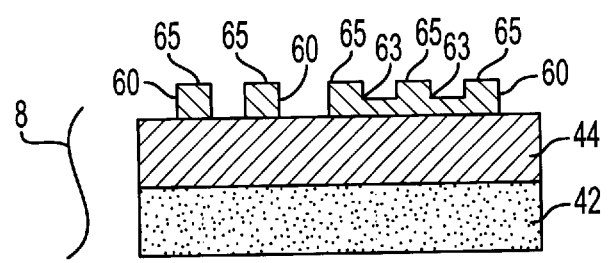

FIG. 7B is a cross-sectional representation of Wafer 8 after developing Photoresist Layer 58. Since the exposure time for Mask 56 may be less than or equal to the exposure time for the first mask, Mask 40 (shown in FIG. 5A), the resultant thickness for Photoresist Layer 58 may vary across the layer. Thus, during metal etch, the metal etchant must etch through Thin Resist Areas 63 before etching the underlying metal layer. Accordingly, select portions of the target feature 68 are etched to a depth less than the depth of the Patterned Metal Layer 62 (shown in FIG. 7C).

Figure 7C:
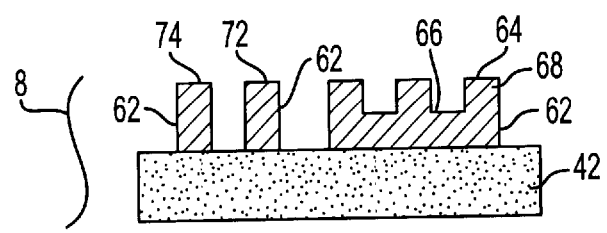

FIG. 7C is a cross-sectional representation of Wafer 8 after metal etch showing Patterned Metal Layer 62 on Substrate 42. Patterned Metal Layer 62 includes Metal Feature 68 and Small Feature 72 and 74. As can be seen in FIG. 7C, certain areas, such as area 64 of Patterned Metal Layer 62 are thicker than certain other areas, such as area 66. Therefore, the topography of Feature 68 more closely approximates the topography of Small Features 72 and 74.

Figure 7D:
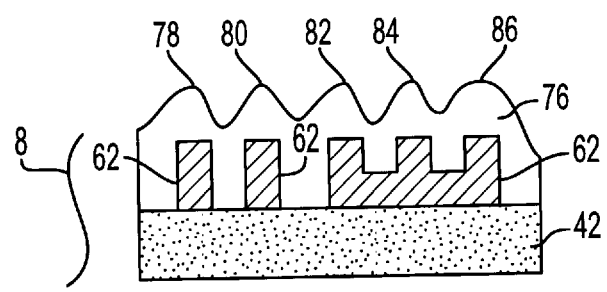

FIG. 7D is a cross-sectional representation of Wafer 8 after deposition of ILD 76. The topography of ILD 76 is more regular or consistent across Wafer 8. Therefore areas 78, 80, 82, 84 and 86 are similar in size, and thus may be removed at a similar rate during a subsequent CMP process.

Figure 8:
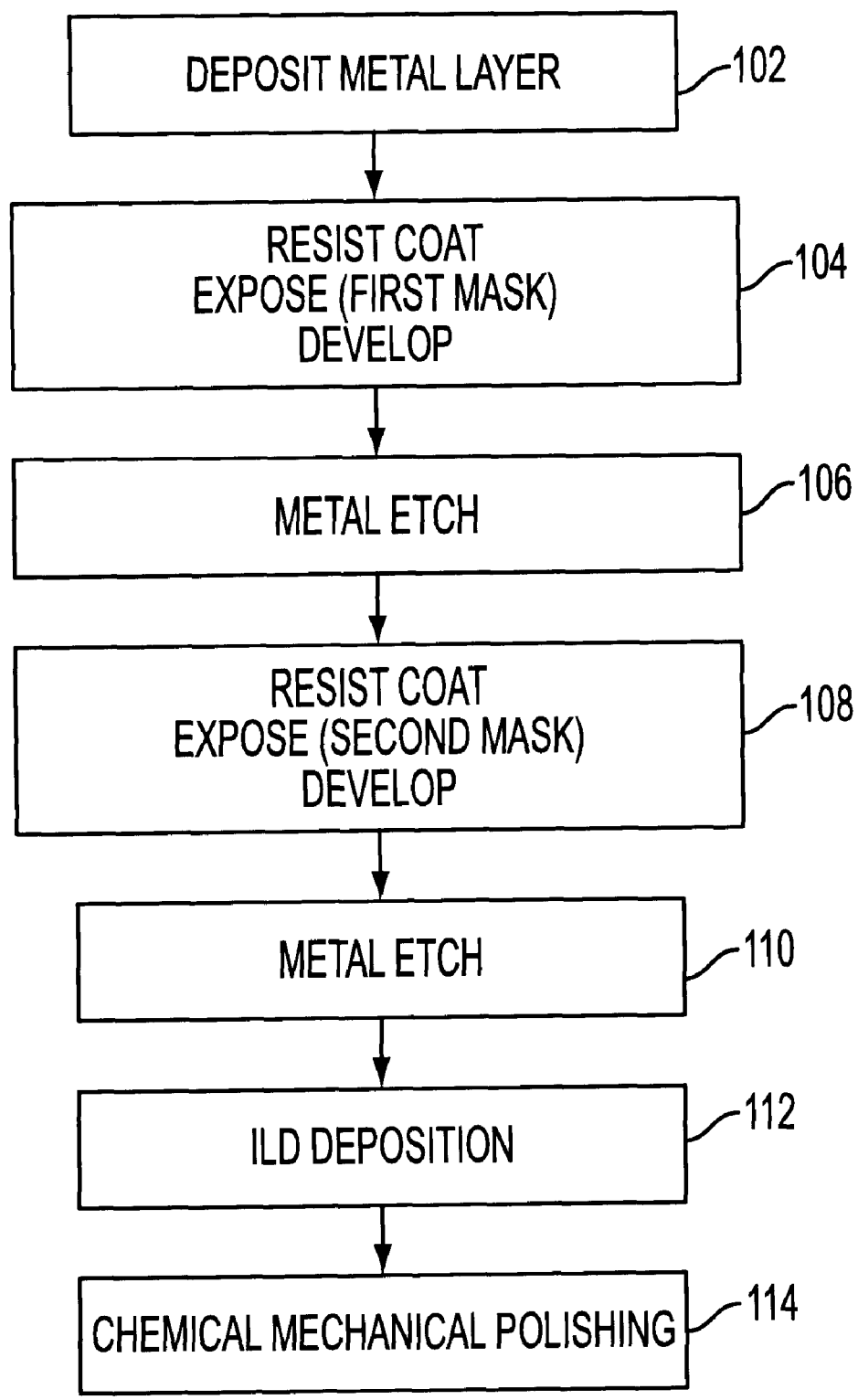
FIG. 8 is a flow diagram of another illustrative metal etch and CMP process in accordance with the present invention.

FIG. 8 is a flow diagram of another illustrative embodiment of the present invention. This embodiment incorporates a double mask and double etch process. At step 102, the metal layer is deposited on the wafer. At step 104, the wafer is coated with photoresist, exposed using a first mask, and developed. At step 106, the pattern for the metal layer is etched for a first etch period using a conventional etch process. At step 108, a second photoresist coat, exposure, and develop process is implemented. This second process uses a second mask that defines a second pattern on the patterned metal layer. At step 110, the second pattern in the patterned metal layer is etched for a second etch period using a conventional metal etch process. If the second etch period is less than or equal to the first etch period, the thickness of the second pattern in the patterned metal layer will be less than or equal to the thickness of the deposited metal layer. After metal etch, an ILD is deposited at step 112. CMP is then implemented to planarize the wafer at step 114.

In the present invention, selective etching of the patterned layer is preferably applied to certain large target features. These target features may include bonding pads, power buses, or any other relatively large feature such as those that have a lateral dimension that is at least as great as two times the minimum layer width plus the minimum layer spacing, or the minimum layer width plus two times the minimum layer spacing, as defined by the design rules. Some of these features are much larger in area in comparison to minimum features elsewhere in the circuit, such as metal interconnect lines. Therefore, the topography of a layer covering the large features will be substantially different than the topography of the layer covering the small features. By selectively etching portions of the large features to more closely approximate the topography of the small features, variations in the topography can be reduced, particularly after a CMP process.

Figure 9:
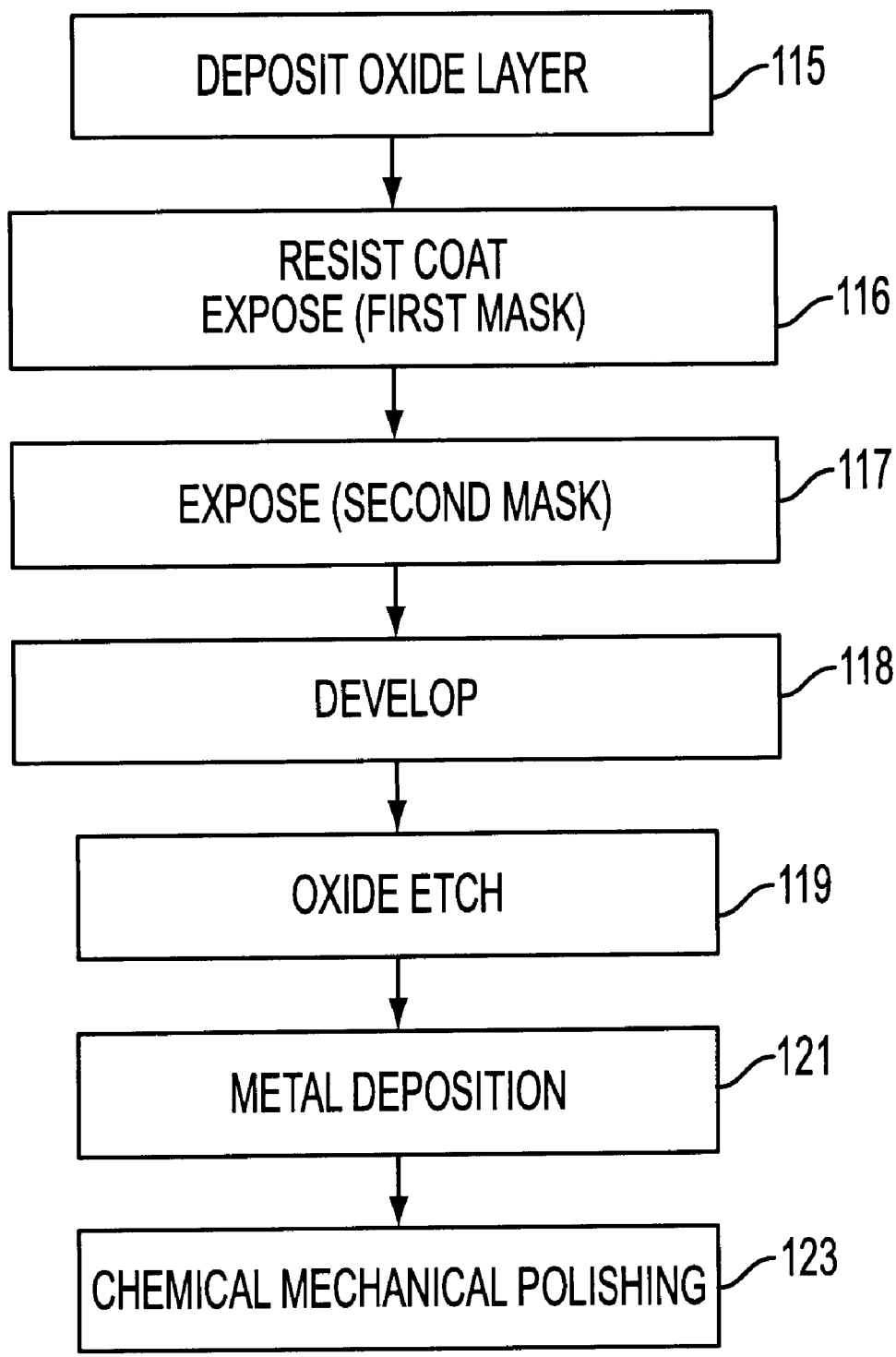
FIG. 9 is a flow diagram of an illustrative method for forming a damascene structure with a CMP planarization process in accordance with the present invention.

FIG. 9 is a flow diagram of an illustrative method for forming a damascene structure with a CMP planarization process in accordance with the present invention. At step 115, an oxide layer is deposited. While an oxide layer is used for illustration, any suitable layer may be provided. At step 116, photoresist is applied and exposed to a pattern using a first mask for a first period of time. The first period of time is preferably the same period of time used in a conventional damascene process, but it may be less. The first mask is used to define grooves or openings that define the interconnect lines of the desired circuit, and in particular, the interconnect lines required for circuit functionality or operation.

At step 117, the wafer is again exposed using a second mask. The second mask is used to pattern certain select portions of pre-selected target features of the oxide layer to alter the topography of the target features. In one illustrative embodiment, the second mask defines one or more openings, grooves or trenches in the selected spaces between the metal interconnect lines. The selected spaces preferably have a lateral dimension that is at least as great as the minimum interconnect layer width plus two times the minimum interconnect layer spacing, as defined by the design rules, but other minimum dimensions may be used.

The wafer is then exposed for an equal or shorter period of time than the exposure time for the first mask so that the pattern defined by the second mask is not developed entirely through the photoresist. At step 118, the photoresist is developed so that all or part of the exposed portions is removed.

At step 119, the top surface of the wafer is subject to an oxide etchant. The oxide etchant is selected to etch the remaining photoresist, as well as the exposed oxide layer, preferable at similar rates. Thus, in those areas where some photoresist remains, the etchant must etch through the photoresist before etching the underlying oxide layer. Accordingly, the select portions of the oxide in the spaces between the defined interconnect lines are etched to a depth that is less than or equal to the depth of the patterned oxide layer. At step 121, a metal layer is deposited. The metal layer may be aluminum, copper, or any other conductive material that is suitable for forming interconnect lines. At step 123 the metal layer is planarized using a CMP process.

Figure 10A:
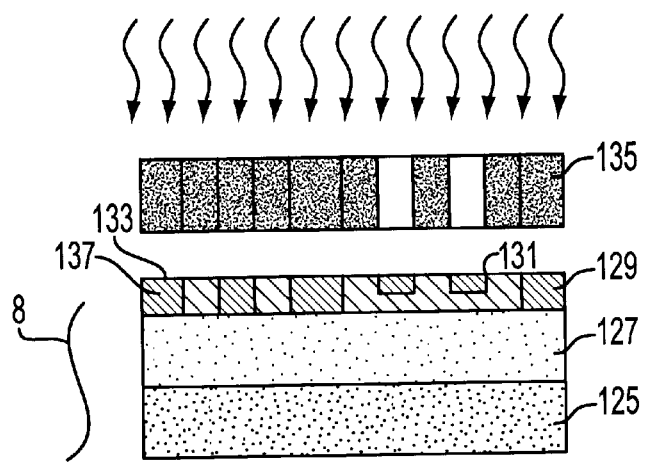
FIGS. 10A–10D are cross-sectional wafer representations of the illustrative process of FIG. 9.

FIGS. 10A–10D are cross-sectional wafer representations of the illustrative process of FIG. 9. In FIG. 10A, Wafer 8 includes Substrate or other layer 125, Oxide Layer 127, and Photoresist Layer 129. Lines 133 in Photoresist Layer 58 show the result of exposure to a first mask, such as Mask 40 as shown in FIG. 5A. As stated above, and for simplicity, Wafer 8 is represented as a single layer.

Wafer 8 is then exposed using a second photolithography process. The second photolithography process is a standard process well known to those skilled in the art. The exposure time for the second photolithography process may be less than or equal to the exposure time for the first photolithography process. The light emitted from the photolithography process alters the chemical nature of the exposed portions of Photoresist Layer 129 so that a subsequent developing process can remove the chemically altered portions. In the example shown in FIG. 10A, the second photolithography process exposure time is less than the first photolithography process exposure time resulting in regions 131 that do not extend all the way through Photoresist Layer 129. Therefore, the subsequent developing process results in Photoresist Layer 129 with both Thin Resist Areas 131 and Thick Resist Areas 137.

Figure 10B:
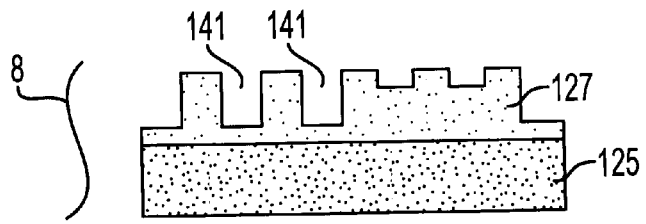

FIG. 10B is a cross-sectional representation of Wafer 8 after developing Photoresist Layer 129 and etching the oxide layer 127. Since the exposure time for Mask 135 may be less than or equal to the exposure time for the first mask, Mask 40 (shown in FIG. 5A), the resultant thickness for Photoresist Layer 129 may vary across the layer. Thus, during the oxide etch, the oxide etchant must etch through Thin Resist Areas 131 before etching the underlying oxide layer. Accordingly, corresponding portions 151 of the oxide layer 127 are etched to a depth that is less than the depth of the regions 141 that define the interconnect lines.

Figure 10C:
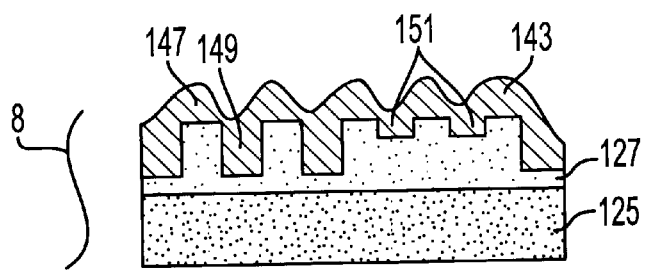
Figure 10D:
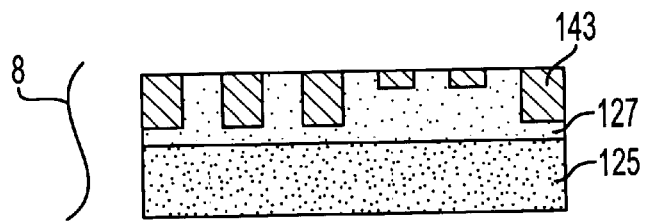

FIG. 10C is a cross-sectional representation of Wafer 8 after a metal layer 143 is provided over the oxide layer 127. As can be seen in FIG. 10C, certain areas, such as area 147 of Metal Layer 143, are thicker than certain other areas, such as area 149, and this pattern is more uniform across the wafer. FIG. 10D is a cross-sectional representation of Wafer 8 after the metal layer 143 is planarized using a CMP process. While FIGS. 9–10 show a damascene processes that uses similar techniques to that described above with respect to FIGS. 6–7, it is contemplated that a damascene process may use techniques similar to that described above with respect to FIG. 8.

FIGS. 11–13 show a relatively large metal feature such as a bonding pad that is selectively etched in accordance with the present invention. In FIG. 11A, a metal layer is etched to form a Spiral Metal Bonding Pad 120 on Substrate 122. Although the number of turns represented in FIG. 11A is 4, Spiral Metal Bonding Pad 120 may include more or less turns. The number of turns may be determined such that the width "w" and spacing "s" conform to the minimum design rules of the particular technology used. Substrate 122 may contain many layers, but for simplicity only one layer is shown.

FIG. 11B represents a cross-sectional view of FIG. 11A taken along line 11—11. In the example shown, spiral Metal Bonding Bad 120 is etched all the way down to substrate 122. However, it is contemplated that the spiral trench may extend only partially into the metal layer, and not all the way to substrate 122.

In FIG. 12A, a metal layer is etched to form a Metal Bonding Pad 124 with openings 126 on Substrate 122. Although the number of Openings 126 represented in FIG. 12A is 90, Metal Bonding Pad 124 may include more or less Openings 126. The number of Openings 126 may be determined such that the width "w" and spacing "s" conform to the minimum design rules of the particular technology used.

FIG. 12B represents a cross-sectional view of FIG. 12A taken along line 12—12. The Openings 126 in Metal Bonding Pad 124 are etched all the way down to Substrate 122. However, it is contemplated that the Openings 126 may extend only partially into the metal layer, and not all the way to Substrate 122.

In FIG. 13A, a metal layer is etched to form a Longitudinal Grooved Metal Bonding Pad 126 with Longitudinal Grooves 128 on Substrate 122. Although the number of Longitudinal Grooves 128 represented in FIG. 13A is 11, Longitudinal Grooved Metal Bonding Pad 126 may include more or less Longitudinal Grooves 128. The number of Longitudinal Grooves 128 may be determined such that the width "w" and spacing "s" conform with the minimum design rules of the particular technology.

FIG. 13B represents a cross-sectional view of FIG. 13A taken along line 13—13. Longitudinal Grooved Metal Bonding Pad 126 is etched all the way down to Substrate 122. However, it is contemplated that Longitudinal Grooves 128 may extend only partially into the metal layer, and not all the way to Substrate 122.

It is important to note that the present invention is not limited to the selective etching of a metal layer. Selective etching can be implemented on any patterned layer, barring circuit operations constraints such as functionality, performance, electromigration constraints, etc., so that subsequent layers are less sensitive to the underlying topography when subjected to a CMP process.

Figure 14:
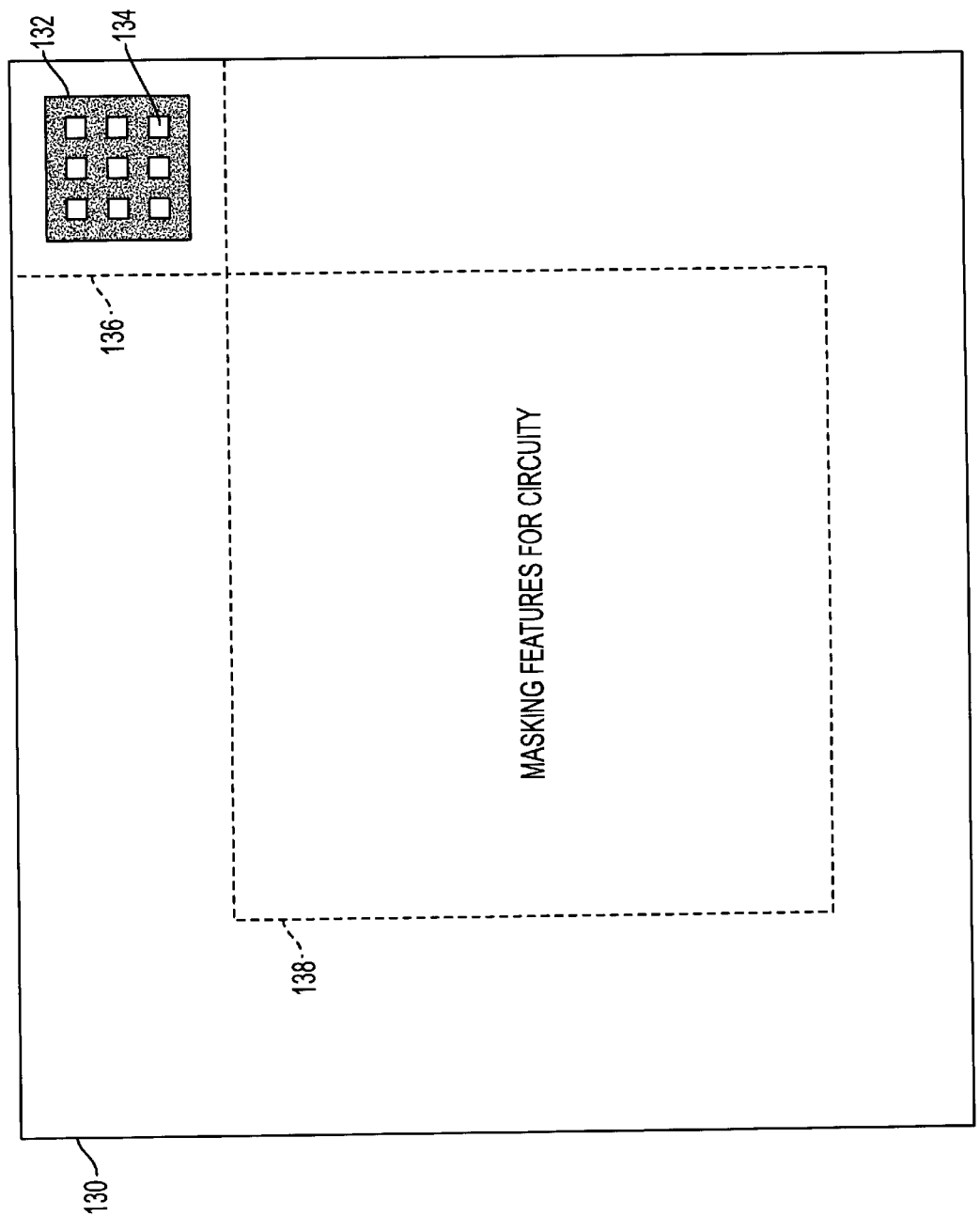
FIG. 14 is a top view of a mask for a layer including at least one bonding pad.
Figure 15:
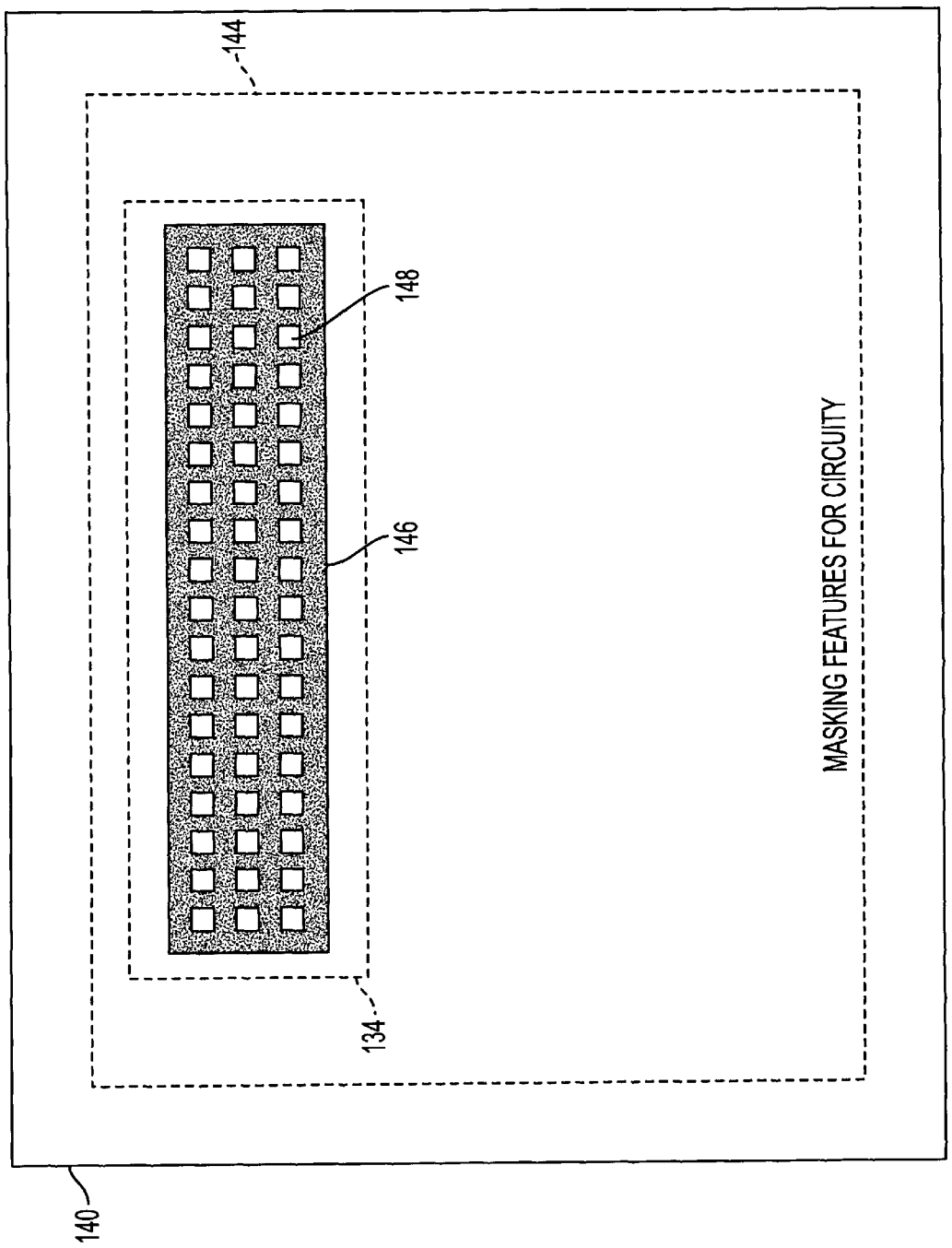
FIG. 15 is a top view of a mask for a layer including at least one large area capacitor.
Figure 16:
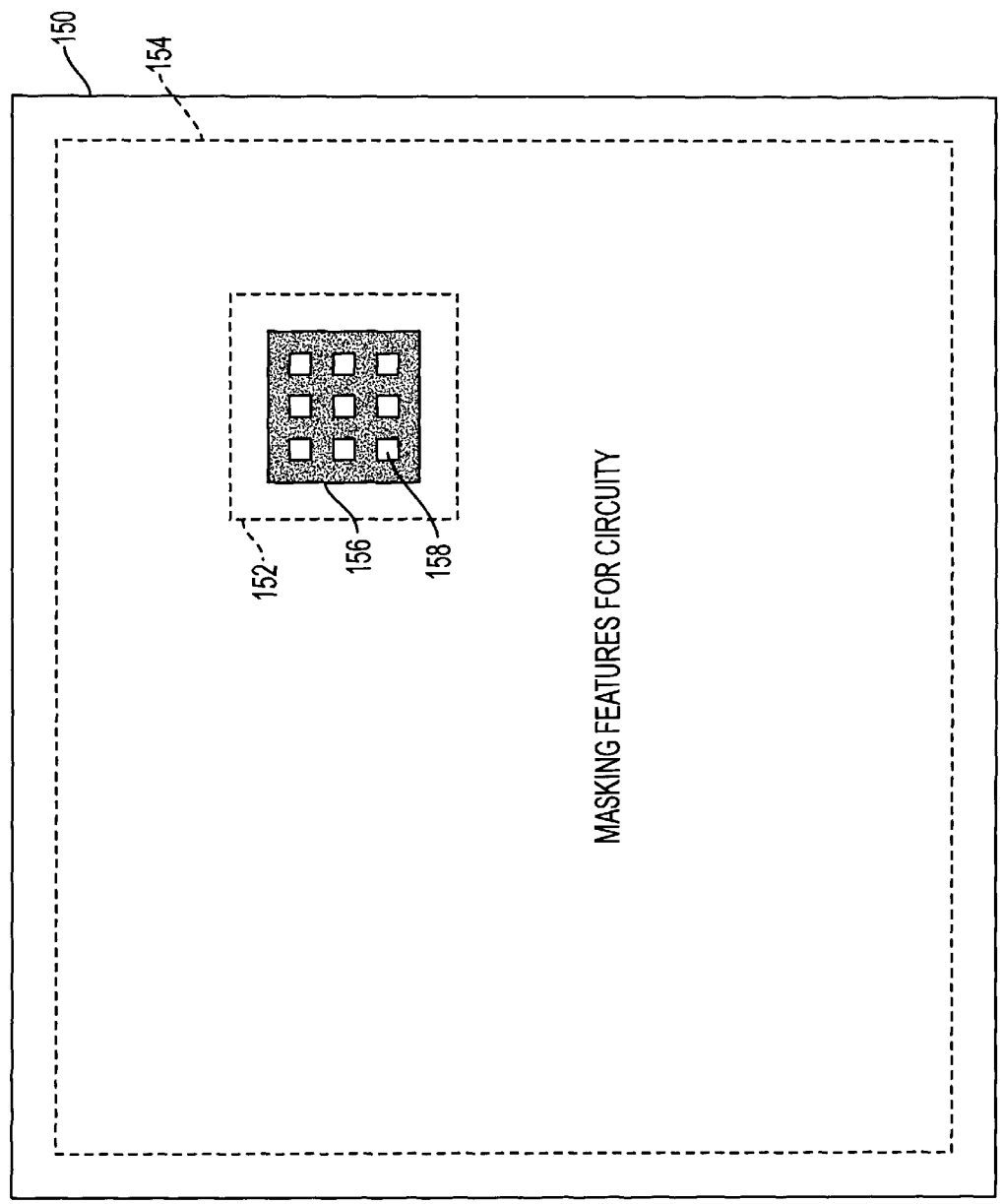
FIG. 16 is a top view of a mask for a layer including at least one power bus.

FIGS. 14–16 represent still yet another embodiment of the present invention. FIG. 14 is a top view of Mask 130. Mask 130 defines, in part, at least one bonding pad 136 and includes at least one Masking Area 138 for defining additional circuitry. For simplicity, details of Masking Area 138 are omitted.

Mask 130 may be used to define a layer of photosensitive material such as photoresist, provided over a substrate that includes a layer to be defined, such as metal. During a conventional photolithography process, the photosensitive layer and the substrate thereunder are exposed to a light source. The photosensitive layer is developed to provide the reverse or the same image of that provided on Mask 130.

A subsequent etch process of the underlying layer results in a patterned layer including at least one bonding pad 132 that include at least one opening 134. The openings 134 preferably extends the full depth of the patterned layer, and are provided to mimic the topography of other areas of the patterned layer, such as area 138.

Mask 130 in FIG. 14 is illustrated for a positive photoresist photolithography process. Mask 130, however, can easily be fabricated to provide for a negative photoresist photolithography process by producing the reverse image on Mask 130. In addition, the at least one Opening 134 in Bonding Pad Area 132 is not limited to the configuration illustrated in FIG. 14. Mask 130 may include other configurations, such as spiral openings or elongated grooved openings, to produce bonding pads similar to those illustrated in FIGS. 11–13.

FIG. 15 is a top view of a Mask 140. Mask 140 defines, in part, at least one power bus and includes at least one Masking Area 144 for defining the at least one power bus. Mask 140 may also include at least one Masking Area 144 that defines additional circuitry. For simplicity, the details of Masking Area 144 are omitted.

Mask 140 may be used to define a layer of photosensitive material such as photoresist, provided over a substrate that includes a layer to be defined, such as metal. During a conventional photolithography process, the photosensitive layer and the substrate thereunder are exposed to a light source. The photosensitive layer is developed to provide the reverse or same image of that provided on Mask 140. A subsequent etch process of the underlying layer results in a patterned layer including at least one power bus 146 with at least one opening 148. The openings 148 preferably extends the full depth of the patterned layer, and are provided to mimic the topography of other areas of the patterned layer, such as area 144.

FIG. 16 is a top view of Mask 150. Mask 150 may define, in part, at least one large area capacitor such as a polysilicon capacitor. Mask 150 includes at least one Masking Area 152 for defining the at least one polysilicon capacitor. Mask 150 may also include at least one Masking Area 154 defining additional circuitry. For simplicity, details of Masking Area 154 are omitted.

Mask 150 may be used to define a layer of photosensitive material such as photoresist, provided over a substrate that includes a layer to be defined, such as polysilicon. During a conventional photolithography process, the photosensitive layer and the substrate thereunder are exposed to a light source. The photosensitive layer is developed to provide the reverse or same image of that provided on Mask 150 A subsequent etch process of the underlying layer results in a patterned layer including at least one polysilicon capacitor 156 that include at least one opening 158. The at least one opening 158 preferably extends the full depth of the patterned layer, and is provided to mimic the topography of other areas of the patterned layer, such as area 154.

Another use for the present invention is to increase the uniformity of the thickness of an etchant that is spun onto the surface of a wafer. In some manufacturing processes, etchant is spun onto the surface of the wafer in an attempt to achieve a relatively uniformly distributed etchant layer. Without the present invention, however, the nonuniform topology of the top patterned surface of many wafers may cause the thickness of the etchant to vary across the wafer. For example, the wafer surface may have a number of features that are required for the functionality of a circuit. There is often a region on the wafer surface that has a higher density of features and another region that has a lower density of features. This results in a non-uniform surface topology across the wafer.

In accordance with the present invention, openings, grooves, or trenches may be etched into the top patterned layer of the wafer in the region having the lower density of features. Thus, the surface topology of the lower density region may mimic that of the region with the high density of features. This may provide a more uniform surface topology across the layer. By having a more uniform topology, the thickness of a spunon-etchant may be more uniform. This may decrease the feature size that can be achieved, and may increase the yield of the manufacturing process.

Having thus described the preferred embodiments of the present invention, those of skill in the art will readily appreciate that the teachings found herein may be applied to yet other embodiments within the scope of the claims hereto attached.

What is claimed is:

1. A method for improving the planarization of a top layer provided over a patterned layer on a semiconductor wafer, said patterned layer including at least one target feature, said method comprising the steps of:
    etching at least one opening that extends a predetermined depth into said at least one target feature, wherein the at least one opening is not required for circuit functionality;
    providing said top layer on said patterned layer; and
    planarizing said top layer using a chemical mechanical polishing process.

2. The method recited in claim 1, wherein said patterned layer is a patterned metal layer having a thickness and said top layer is a dielectric layer.

3. The method recited in claim 2, wherein said at least one target feature is a metal bonding pad.

4. The method recited in claim 3, wherein said predetermined depth is less than said thickness of said patterned metal layer.

5. The method recited in claim 2, wherein said predetermined depth is equal to said thickness of said patterned metal layer.

6. The method recited in claim 2, wherein a plurality of openings are etched into said at least one target feature and said openings are etched a predetermined distance from one another.

7. The method recited in claim 6, wherein said predetermined distance approximates a spacing between metal lines.

8. The method recited in claim 1, wherein said patterned layer is a patterned oxide layer having a thickness and said top layer is a metal layer.

9. The method recited in claim 1, wherein said patterned layer is a patterned poly layer having a thickness and said top layer is a dielectric layer.

10. The method recited in claim 1, wherein etching said at least one opening includes:

depositing a layer of photoresist;

exposing said layer of photoresist using a first mask for a first duration of time; and exposing said photoresist using a second mask for a second duration of time, said second duration of time shorter than said first duration of time.

11. The method recited in claim 10, wherein said at least one opening is etched at the same time as said patterned layer.

12. The method recited in claim 1, wherein etching said at least one opening includes:

depositing a first layer of photoresist;

exposing said first layer photoresist using a first mask for a first duration of time;

developing said first layer of photoresist;

etching a pattern in said patterned layer for a first period of time;

depositing a second layer of photoresist;

exposing said second layer of photoresist using a second mask for said first duration of time;

developing said second layer of photoresist; and etching said plurality of openings for a second period of time, said second period of time equal to or less than said first period of time.

* * * * *